US011401606B2

(12) United States Patent
Zhang et al.

(10) Patent No.: US 11,401,606 B2
(45) Date of Patent: Aug. 2, 2022

(54) COATING NOZZLE, COATING DEVICE AND CORRESPONDING COATING METHOD

(71) Applicant: BOE Technology Group Co., Ltd., Beijing (CN)

(72) Inventors: Song Zhang, Beijing (CN); Tao Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 657 days.

(21) Appl. No.: 16/306,308

(22) PCT Filed: Jan. 17, 2018

(86) PCT No.: PCT/CN2018/072962
§ 371 (c)(1),
(2) Date: Nov. 30, 2018

(87) PCT Pub. No.: WO2019/019569
PCT Pub. Date: Jan. 31, 2019

(65) Prior Publication Data
US 2020/0181773 A1    Jun. 11, 2020

(30) Foreign Application Priority Data
Jul. 28, 2017   (CN) .......................... 201710637283.4

(51) Int. Cl.
*C23C 16/455* (2006.01)
*B05C 1/10* (2006.01)
(Continued)

(52) U.S. Cl.
CPC .......... *C23C 16/45519* (2013.01); *B05B 1/10* (2013.01); *B05B 13/0221* (2013.01); *C23C 16/45574* (2013.01); *C23C 16/54* (2013.01)

(58) Field of Classification Search
USPC ...................... 118/715, 723 r, 718, 728, 729; 427/255.5, 96.8; 438/680, 765;
(Continued)

(56) References Cited

U.S. PATENT DOCUMENTS 8,808,799 B2     8/2014  Madigan et al.
2003/0194493 A1*  10/2003  Chang ............... C23C 16/45519
                                                427/248.1
(Continued)

FOREIGN PATENT DOCUMENTS

CN        1827230 A      9/2006
CN      102414863 A      4/2012
(Continued)

OTHER PUBLICATIONS

First Office Action, including Search Report, for Chinese Patent Application No. 201710637283.4, dated Dec. 11, 2018, 15 pages.
(Continued)

*Primary Examiner* — Yewebdar T Tadesse
(74) *Attorney, Agent, or Firm* — Westman, Champlin & Koehler, P.A.

(57) ABSTRACT

The present disclosure proposes a coating nozzle, a coating device and a corresponding coating method. The nozzle includes: a first reactant spout configured to spray a first reactant; a second reactant spout configured to spray a second reactant; and a first air curtain spout configured to spray shielding gas, so that the sprayed shielding gas forms an air curtain which isolates the first reactant from the second reactant. The device includes: one or more coating nozzles described above; and a transport mechanism configured to transport an object to be coated, so that the object to be coated sequentially passes through a first reaction region of the first reactant and a second reaction region of the second reactant for each of the one or more nozzles.

8 Claims, 11 Drawing Sheets

(51) Int. Cl.
    *C23C 16/54*     (2006.01)
    *B05B 1/10*     (2006.01)
    *B05B 13/02*     (2006.01)

(58) Field of Classification Search
    USPC .......................... 156/345.54, 345.34, 345.33
    See application file for complete search history.

(56) References Cited

U.S. PATENT DOCUMENTS

| | | | |
|---|---|---|---|
| 2009/0081374 A1* | 3/2009 | Yang | C23C 16/545 427/487 |
| 2009/0130858 A1* | 5/2009 | Levy | C23C 16/45525 118/728 |
| 2013/0098477 A1* | 4/2013 | Yudovsky | C23C 16/45536 137/507 |
| 2013/0164445 A1* | 6/2013 | Kwong | C23C 16/44 427/255.5 |
| 2013/0323420 A1 | 12/2013 | Knaapan et al. | |
| 2015/0184295 A1 | 7/2015 | Jeong | |
| 2015/0368798 A1 | 12/2015 | Kwong et al. | |
| 2017/0365447 A1 | 12/2017 | Kim | |

FOREIGN PATENT DOCUMENTS

| | | |
|---|---|---|
| CN | 103261478 A | 8/2013 |
| CN | 103614705 A | 3/2014 |
| CN | 103988286 A | 8/2014 |
| CN | 104264128 A | 1/2015 |
| CN | 104488067 A | 4/2015 |
| CN | 105026614 A | 11/2015 |
| CN | 106032573 A | 10/2016 |
| CN | 106048561 A | 10/2016 |
| CN | 106252257 A | 12/2016 |
| CN | 107419239 A | 12/2017 |
| EP | 1 167 569 A1 | 1/2002 |

OTHER PUBLICATIONS

English translation of International Search Report and Box V of Written Opinion for International Application No. PCT/CN2018/072962, dated Apr. 13, 2018, 4 pages.

* cited by examiner

COATING NOZZLE, COATING DEVICE AND CORRESPONDING COATING METHOD

CROSS-REFERENCE TO RELATED APPLICATION(S)

This application is a Section 371 National Stage application of International Application No. PCT/CN2018/072962, filed on 17 Jan. 2018, which has not yet published, and claims priority to Chinese Patent Application No. 201710637283.4, filed on Jul. 28, 2017, the contents of which are incorporated herein by reference in their entireties.

TECHNICAL FIELD

The present disclosure relates to the field of thin film encapsulation, and more particularly, to a coating nozzle, a coating device, and a corresponding coating method.

BACKGROUND

Organic Light-emitting Diodes (OLEDs for short) are susceptible to the erosive effect of water and oxygen due to their sensitivity to moisture and oxygen, thereby resulting in a reduced lifetime thereof. Encapsulation is a key technique to increase their lifetime. In recent years, in a process of preparing flexible OLED devices, a Thin Film Encapsulation (TFE for short) method is often used. The TFE is a stack of multiple thin film layers, and mainly has two functions, i.e., a water blocking layer and a flat layer.

As the flexible OLED devices currently evolve from a flexible form of bending or crimping to a flexible form of folding, a radius of curvature thereof is getting smaller and smaller. Therefore, it is necessary to develop a technique which satisfies the smaller radius of curvature.

SUMMARY

According to a first aspect of the present disclosure, there is provided a coating nozzle. The nozzle comprises: a first reactant spout configured to spray a first reactant; a second reactant spout configured to spray a second reactant; and a first air curtain spout configured to spray shielding gas, so that the sprayed shielding gas forms an air curtain which isolates the first reactant from the second reactant.

In some embodiments, the nozzle further comprises: a second air curtain spout configured to spray shielding gas which together with the shielding gas sprayed through the first air curtain spout forms air curtains for defining a reaction region for the first reactant. In some embodiments, the nozzle further comprises: a first outlet configured to discharge an excessive portion of the first reactant and/or a reaction by-product; and a second outlet configured to discharge an excessive portion of the second reactant and/or a reaction by-product. In some embodiments, the nozzle further comprises: a reaction medium spout configured to spray a reaction medium which catalyzes reaction of the first reactant with the second reactant. In some embodiments, the reaction medium is plasma. In some embodiments, the nozzle comprises multiple serial connected groups of spouts, wherein each group of spouts comprises at least the first reactant spout, the second reactant spout, the first air curtain spout, and the second air curtain spout. In some embodiments, the first air curtain spout is provided between the first reactant spout and the second reactant spout; and the second air curtain spout is provided between the first reactant spout and a previous group of spouts. In some embodiments, each group of spouts further comprises the first outlet and the second outlet described above, and in this case, the first air curtain spout is provided between "the first reaction spout and the first outlet" and "the second reaction spout and the second outlet"; and the second air curtain spout is provided between "the first reaction spout and the first outlet" and the previous group of spouts. In some embodiments, a spraying pressure for the first air curtain spout and/or the second air curtain spout is greater than that for the first reactant spout and/or the second reactant spout.

According to another aspect of the present disclosure, there is provided a coating device. The device comprises: one or more coating nozzles according to the present disclosure; and a transport mechanism configured to transport an object to be coated, so that the object to be coated sequentially passes through a first reaction region of the first reactant and a second reaction region of the second reactant for each of the one or more nozzles.

In some embodiments, the object to be coated is transported in a linear reciprocating manner by using the transport mechanism.

According to yet another aspect of the present disclosure, there is provided a coating method. The method comprises: spraying shielding gas and forming air curtains to define a first reaction region; spraying, in the first reaction region, a first reactant onto an object to be coated passing through the first reaction region to form a first reactant layer on a specified region of the object to be coated; and spraying, outside the first reaction region, a second reactant onto the object to be coated having the first reactant layer formed thereon, so that the first reactant layer reacts with the second reactant and a desired film layer is formed on the object to be coated.

In some embodiments, the object to be coated passes through the first reaction region in a linear reciprocating manner. In some embodiments, the method further comprises: after the first reactant layer is formed, discharging an excessive portion of the first reactant in the first reaction region; and after the desired film layer is formed, discharging an excessive portion of the second reactant and/or a reaction by-product outside the first reaction region. In some embodiments, the method further comprises: before the second reactant is sprayed, spraying a reaction medium for catalyzing reaction of the first reactant with the second reactant. In some embodiments, the reaction medium is plasma.

BRIEF DESCRIPTION OF THE DRAWINGS

The above and other purposes, features and advantages of the present disclosure will become more apparent from the preferable embodiments of the present disclosure in conjunction with accompanying drawings, in which.

DETAILED DESCRIPTION

Figure 1:
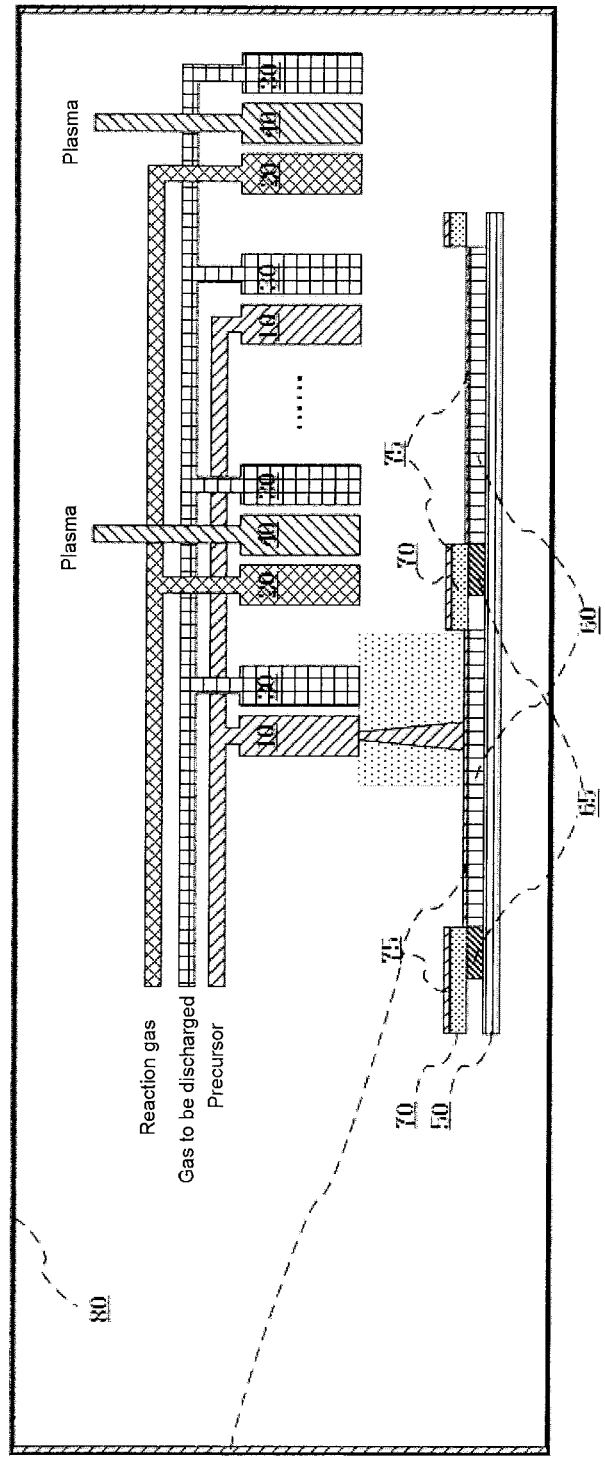
FIG. 1 is a cross-sectional view illustrating an exemplary coating device according to an embodiment of the present disclosure, in which it is illustrated that a first reactant is being sprayed.

A part of the embodiments of the present disclosure will be described in detail below with reference to the accompanying drawings, and the details and functions which are not necessary for the present disclosure are omitted in the description, to avoid confusion of the understanding of the present disclosure. In the present specification, various embodiments described below for describing the principles of the present disclosure are merely illustrative and should not be construed as limiting the scope of the present disclosure in any way. The following description with reference to the accompanying drawings comprises numerous specific details are used to assist in a comprehensive understanding of the exemplary embodiments of the present disclosure which are defined by the claims and their equivalents. The following description comprises numerous specific details to assist in the understanding, but these details should be considered to be merely exemplary. Therefore, it will be apparent to those of ordinary skill in the art that various changes and modifications may be made to the embodiments described herein without departing from the scope and spirit of the present disclosure. In addition, descriptions of well-known functions and constructions are omitted for clarity and conciseness. In addition, the same reference signs are used throughout the accompanying drawings for the same or similar functions, devices and/or operations. In addition, in the accompanying drawings, various parts are not necessarily drawn to scale. In other words, relative sizes, lengths, etc. of various parts in the accompanying drawings do not necessarily correspond to actual ratios.

In the present disclosure, the terms "comprise" and "comprising" and their derivatives are intended to be inclusive and not limiting; and the term "or" is inclusive, meaning and/or. In addition, in the following description of the present disclosure, the orientation terms used, such as "upper", "lower", "left", "right", etc., are used to indicate relative positional relationships to assist those skilled in the art in understanding the embodiments of the present disclosure. Further, it should be understood by those skilled in the art that "upper"/"lower" in one direction may become "lower"/"upper" in an opposite direction, and may become another positional relationship, such as "left"/"right", etc., in another direction.

Hereinafter, description is made in detail by taking the present disclosure being applied to thin film encapsulation of an OLED device as an example. However, it should be understood by those skilled in the art that the field to which the present disclosure is applied is not limited thereto. In fact, the nozzle, device, and/or method according to the embodiments of the present disclosure may be applied to other fields where coating is required.

As described above, when a flexible OLED device is manufactured, since an organic light-emitting layer in the OLED device may be damaged when it encounters water or oxygen, thin film encapsulation is required to be performed on the OLED device. As an emerging thin film encapsulation technique, the Atomic Layer Deposition (ALD for short) technique may accurately control a thickness of an encapsulation film layer, and may achieve good step coverage characteristics and uniformity of a thickness of the film which is only a few tens of nanometers, and is considered to be a promising encapsulation technique.

Firstly, a principle of the ALD technique will be generally described. The ALD is a thin film deposition method in which a surface of a substrate may be alternatively exposed to two gas phase chemical substances (for example, hereinafter referred to as a first reactant and a second reactant, respectively) to grow an extremely thin uniform film layer on the substrate. Compared to Chemical Vapor Deposition (CVD), these two reactants do not appear in a reaction chamber at the same time, but may alternately appear in the reaction chamber sequentially. In a phase of reaction of each reactant, molecules of the reactant may react with the surface of the substrate in a self-limiting manner, so that the reaction will not proceed once the reaction is performed at all sites available for the reaction on the surface of the substrate. In other words, after the reaction is completed, a precursor thin film layer or a final product thin film layer with a uniform thickness should be formed on the surface of the substrate. At the end of the phase of the reaction of each reactant, an excessive portion of the reactant may be discharged (for example, extracted) through an outlet (extraction port). Then, another reactant is introduced in the reaction chamber, and the process proceeds to a next phase. This process may be repeated to form multiple uniform thin film layers with a specified thickness on the surface of the substrate.

Next, a flow of the ALD technique will be described in detail by taking formation of a thin film of aluminum oxide ($AL_2O_3$) using the ALD technique as an example. Since water vapor is present in the air, a hydroxyl group may be formed on the substrate, and is bonded to silicon atoms in the substrate to form Si—O-$H_{(s)}$. The substrate is then placed in a reaction chamber and a first reactant or a precursor gas of TMA (Trimethyl Aluminum) is introduced in the reaction chamber. At this time, the TMA reacts with the hydroxyl group formed on the substrate to form methane ($CH_4$) as a reaction by-product, and a reaction formula (1) is as follows:

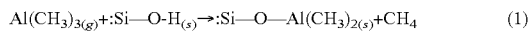 (1)

At this time, since the TMA does not react with itself, after an extremely uniform thin film layer of Si—O—$Al(CH_3)_{2(s)}$ is formed on the surface of the substrate, the reaction stops. Next, an excessive portion of TMA and the reaction by-product of methane are discharged. Then, in the absence of the TMA and the methane in the reaction chamber, a second reactant (or reaction gas) of water or water vapor ($H_2O$) may be introduced into the reaction chamber. In addition, a reaction medium (for example, plasma) may optionally be introduced to catalyze the reaction. Alternatively, it is also possible to catalyze the reaction by heating instead of using the plasma. At this time, a reaction formula (2) is as follows:

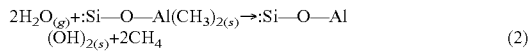 (2)

At this time, as in the previous phase, a reaction by-product of methane and an excessive portion of the water vapor are discharged. The TMA phase and the $H_2O$ phase described above may then be repeated in sequence, and a reaction formula is as follows:

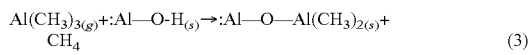 (3)

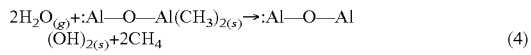 (4)

Finally, multiple thin film layers of $Al_2O_3$ may be obtained, and various layers have a very uniform thickness of about 1 angstrom.

Next, an ALD coating scheme according to some embodiments of the present disclosure will be described in more detail in conjunction with FIGS. 1-4.

Figure 4:
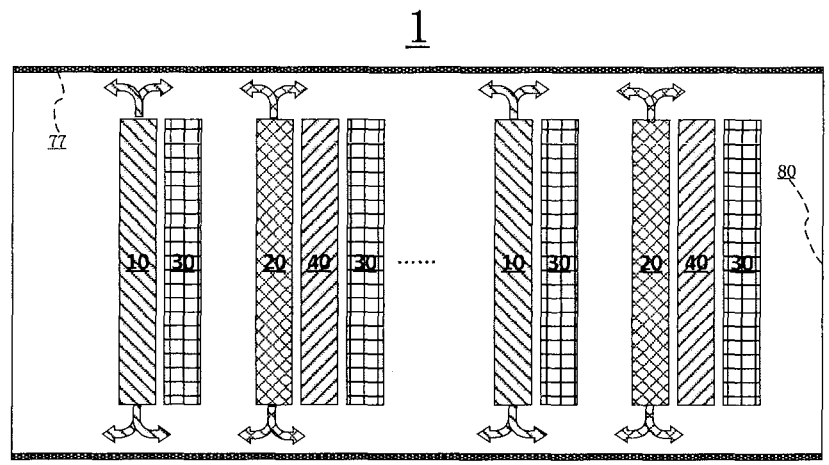
FIG. 4 is a plan view illustrating an exemplary coating device according to an embodiment of the present disclosure.

FIG. 1 is a cross-sectional view illustrating an exemplary coating device 1 according to an embodiment of the present disclosure, in which a first reactant is being sprayed. As shown in FIGS. 1 and 4, the coating device 1 may comprise one or more nozzles, and each of the one or more nozzles may comprise: a first reactant (or precursor) spout 10, a second reactant (or reaction gas) spout 20, one or more outlets 30, and a reaction medium spout 40.

It should be illustrated that the reaction medium spout 40 is optional. For example, in a case where the reaction is catalyzed by heating instead of using plasma, the reaction medium spout 40 may not exist.

In the example in which the thin film of aluminum oxide is formed, the first reactant or precursor may be, for example, TMA, and the second reactant or reaction gas may be, for example, water or water vapor. Further, the reaction medium may be plasma. However, the present disclosure is not limited thereto, and in fact, the embodiments of the present disclosure are also applicable to a scheme for preparing other thin films of, for example, $Si_xO_y$, $Ti_xO_y$, etc.

Further, as shown in FIG. 1, a substrate 50, as an object to be coated, sequentially passes below various nozzles/spouts. For example, the substrate may be transported in a linear reciprocating manner by using a transport mechanism, to sequentially pass through a first reaction region (as shown in a dotted region in FIG. 1) of the first reactant and a second reaction region (as shown in a dotted region in FIG. 3) of the second reactant of each nozzle. In the embodiment shown in FIG. 1, the substrate is transported in a direction from left to right; however, the present disclosure is not limited thereto.

Figure 5:
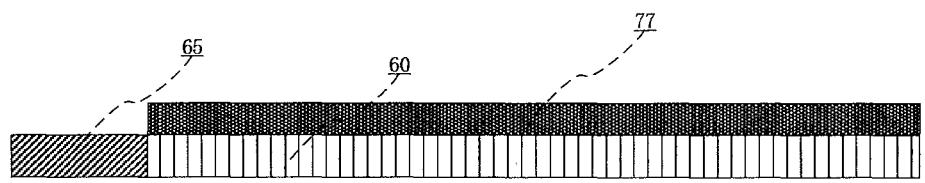
FIG. 5 is a cross-sectional view illustrating an exemplary coated device according to an embodiment of the present disclosure.

Further, as shown in FIGS. 1 and 5, a coating region 60 and a non-coating region 65 are provided on the substrate 50. In some embodiments, the coating region 60 may be, for example, a region to be sealed of the OLED device described above, and the non-coating region 65 may be, for example, a bonding region of the substrate. Therefore, in order to avoid, for example, a film layer of $Al_2O_3$ from being formed on the non-coating region 65, the non-coating region 65 may be covered with a mask 70.

In the embodiment shown in FIG. 1, the process is in a phase of spraying the first reactant or precursor. In this phase, the first reactant, for example, the TMA, is sprayed through the first reactant spout 10, and a first reactant layer or precursor layer 75 is formed on the coating region 60 and the mask 70. It should be illustrated that the first reactant layer 75 here is not necessarily composed of the first reactant, but refers to a film layer formed by physical/chemical reaction of the first reactant with a surface of the substrate 50, and is referred to as the first reactant layer 75 only for convenience. In addition, the first reactant is not limited to the TMA, but may comprise, but not limited to, DIPAS (bisdiethylaminosilane), BEMAS (aminosilane), TMSA (trimethylsilylacetylene), TDMAS (trimethylsilane) etc.

Further, when the first reactant (for example, aluminum hydroxide ($Al(OH)_3$)) is sprayed, the first reactant may be introduced into a reaction chamber by using an optional carrier gas. In the present embodiment, the carrier gas may be shielding gas or inert gas such as nitrogen, helium, argon etc.

Figure 2:
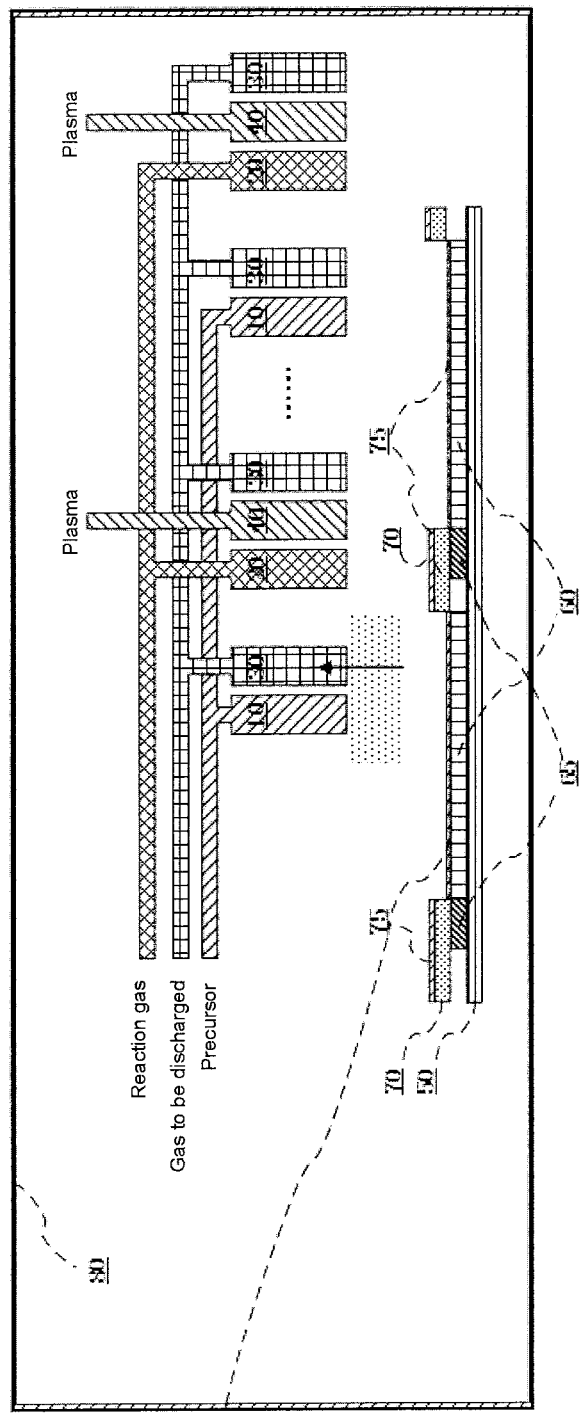
FIG. 2 is another cross-sectional view illustrating the exemplary coating device according to an embodiment of the present disclosure, in which it is illustrated that an excessive portion of the first reactant is being discharged.

FIG. 2 is another exemplary cross-sectional view illustrating the exemplary coating device 1 according to an embodiment of the present disclosure, in which an excessive portion of the first reactant is being discharged. As described above, after the first reactant is sprayed and the first reactant layer 75 is formed as shown in FIG. 1, an excessive portion of the first reactant and/or possibly a by-product need to be discharged from the reaction chamber through a first outlet 30, so as to avoid affecting subsequent steps.

For example, in some embodiments, the excessive portion of the first reactant and/or the reaction by-product may be blown off by purging with shielding gas (for example, an inert gas such as nitrogen, argon, etc.) In some other embodiments, the excessive portion of the first reactant and/or the reaction by-product may also be extracted by vacuum extraction. Further, in the embodiment shown in FIG. 2, the excessive portion of the first reactant and/or possibly the by-product are discharged through the leftmost first outlet 30. However, the present disclosure is not limited thereto, and in fact, the discharging process may be performed by using multiple outlets 30. For example, the discharging process may be performed by using two or more outlets 30 on the left side.

Figure 3:
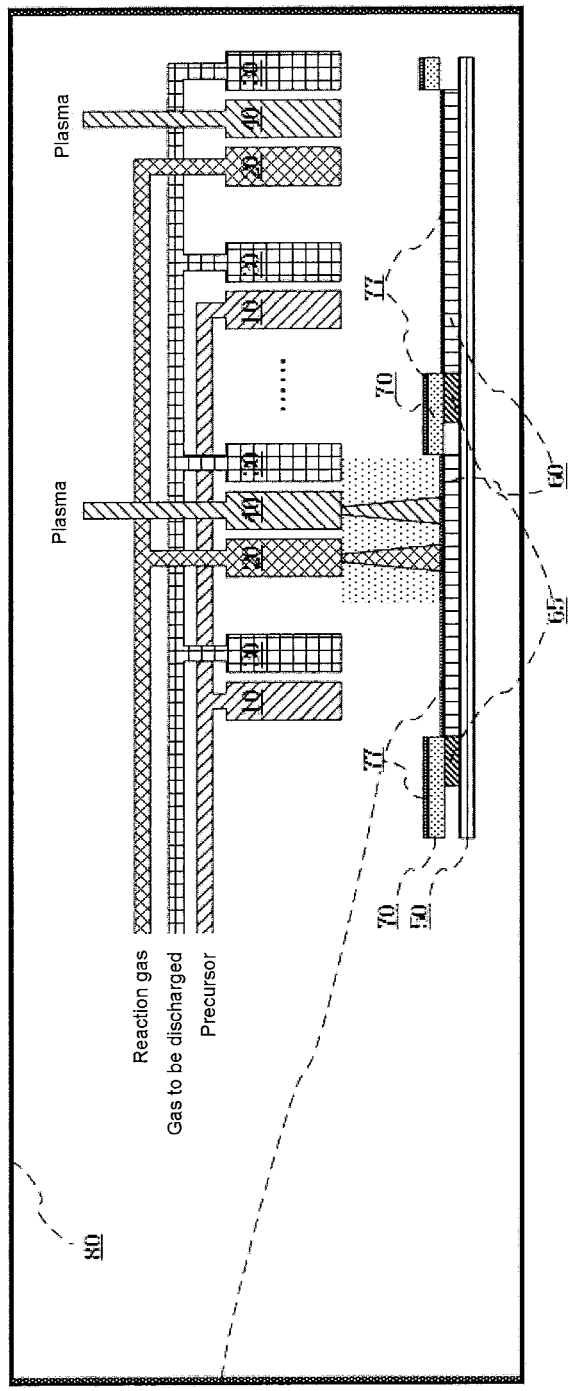
FIG. 3 is yet another cross-sectional view illustrating the exemplary coating device according to an embodiment of the present disclosure, in which it is illustrated that a second reactant and a reaction medium are being sprayed and a final film layer is formed.

FIG. 3 is yet another exemplary cross-sectional view illustrating the exemplary coating device 1 according to an embodiment of the present disclosure, in which a second reactant and a reaction medium are being sprayed and a final film layer 77 is formed. As shown in FIG. 3, after the first reactant and/or the other by-product in the reaction chamber are discharged completely as described above, a second reactant (or a reaction gas) and a reaction medium (for example, the plasma) may be sprayed through the second reactant (or reaction gas) spout 20 and the reaction medium spout 40 respectively. An order in which the second reactant (or reaction gas) spout 20 and the reaction medium spout 40 are sprayed is not limited in the present disclosure, for example, they may be sprayed at the same time or may be sprayed sequentially etc.

Figure 6:
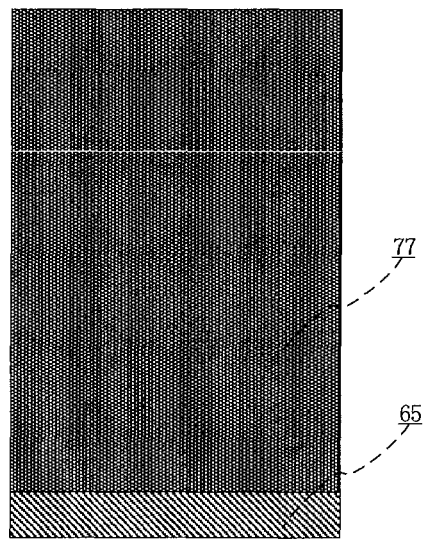
FIG. 6 is a plan view illustrating an exemplary coated device according to an embodiment of the present disclosure.

As described above in connection with the example of the thin film of aluminum oxide, a desired final film layer 77 is formed on the coating region 60, and no film layer is formed on the non-coating region 65 due to the shielding of the mask 70, for example, as shown in FIG. 6. Further, as shown in FIGS. 1-3, since the device 1 may have multiple nozzles, the above process may be repeated for the coating region 60 on the substrate 50 to form desired multiple film layers.

Finally, an excessive portion of the second reactant and/or possibly a reaction by-product may be discharged through another outlet (for example, a second left outlet 30) in a manner similar to that described above for discharging the first reactant, so as to prepare for a next round of performing coating or forming a final product.

Through this process flow, a very thin encapsulation thin film with a uniform thickness may be formed on an object to be coated (for example, the coating region 60 of the substrate 50), thereby enabling, for example, the OLED device to be made thinner and softer while avoiding moisture and air from entering the OLED device.

However, it should be illustrated that, as shown in FIGS. 1-3, in particular, as shown in FIG. 4, encapsulation film layers (for example, the first reactant layer 75 formed in the early phase, and the final film layer 77 formed in the later phase) are also formed on inner walls 80 of the device 1. The film layers thus formed cannot be self-cleaned, which results in the need for periodic manual cleaning of the device 1, thereby seriously affecting the utilization rate of the device.

To this end, there is proposed a coating device 2 according to another embodiment of the present disclosure. Hereinafter, the coating device 2 according to the other embodiment of the present disclosure will be described in detail with reference to FIGS. 7-11.

Figure 7:
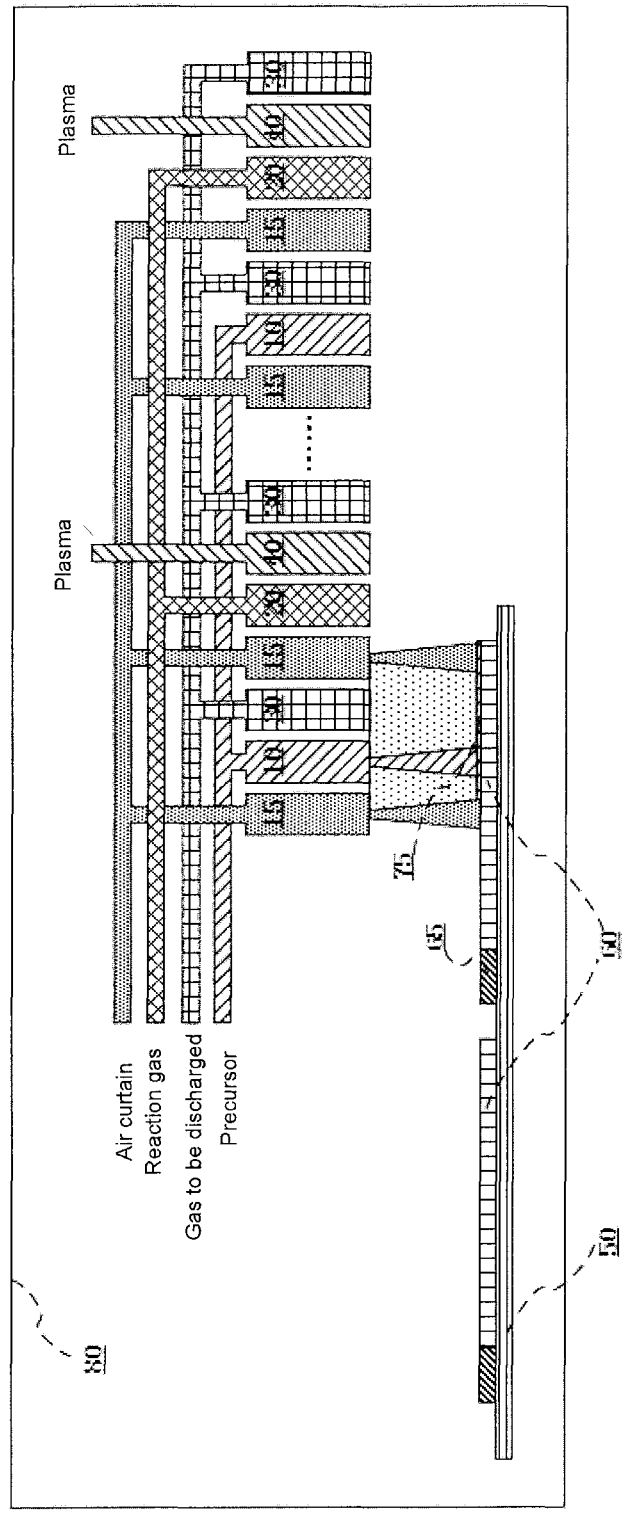
FIG. 7 is a cross-sectional view illustrating an exemplary coating device according to another embodiment of the present disclosure, in which it is illustrated that a first reactant is being sprayed.

FIG. 7 is a cross-sectional view illustrating an exemplary coating device 2 according to another embodiment of the present disclosure, in which a first reactant is being sprayed. As shown in FIG. 7, the coating device 2 may comprise one or more nozzles, and each of the one or more nozzles may comprise: a first reactant (or precursor) spout 10, a second reactant (or reaction gas) spout 20, one or more outlets 30, a reaction medium spout 40, and one or more air curtain spouts 15. The difference from the embodiment described above in connection with FIGS. 1-4 is mainly in that one or more air curtain spouts 15 are added at a periphery of the first reactant spout 10 and a first outlet 30.

The air curtain spouts 15 may be used to spray shielding gas (for example, nitrogen, helium, argon, etc.) and form air curtains to cause a first reactant sprayed through the first reactant spout 10 to be constrained in a first reaction region, as shown in, for example, FIG. 7. Thereby, a first reactant layer formed on inner walls 80 of the device 2 may be avoided or at least reduced. However, it should be illustrated that the air curtain spouts 15 are not necessarily the two spouts as shown in FIG. 7 or the spouts placed on opposite sides of the first reactant spout 10 as shown in FIG. 7, but may be any suitable number of air curtain spouts and/or may be arranged in any suitable manner. As will be described in more detail later, there may also be one, three or more air curtain spouts 15, and the air curtain spouts 15 may have other configurations, so that the first reactant may also be constrained within the first reaction region.

Similarly to the embodiment shown in FIG. 1, the substrate 50, as an object to be coated, may sequentially passes below various nozzles/spouts. For example, the substrate may be transported in a linear reciprocating manner by using a transport mechanism, to sequentially and/or repeatedly pass through a first reaction region of the first reactant and a second reaction region of the second reactant of each nozzle. Similarly to the embodiment shown in FIG. 1, the substrate 50 also has a coating region 60 and a non-coating region 65 provided thereon. However, since a design including the air curtain spouts 15 is used, it is not necessary to provide a mask 70 on the non-coating region 65 of the substrate 50. For example, the transport mechanism may be controlled, so that when the non-coating region 65 is to pass through the first reaction region, the substrate 50 may stop moving and wait, and the non-coating region 65 does not pass through the first reaction region until an excessive portion of the first reactant and/or a reaction by-product is discharged through the first outlet 30. Thereby, film layers 75 and/or 77 are avoided from being formed on the non-coating region 65.

Similarly to FIG. 1, in the embodiment shown in FIG. 7, the process is also in a phase of spraying the first reactant or precursor. In this phase, the first reactant, such as the TMA described above, is sprayed through the first reactant spout 10, and the first reactant layer or precursor layer 75 is formed only on the coating region 60. Similarly, it is possible to introduce the first reactant into a reaction chamber through the first reactant spout 10 by using an optional carrier gas.

Figure 8:
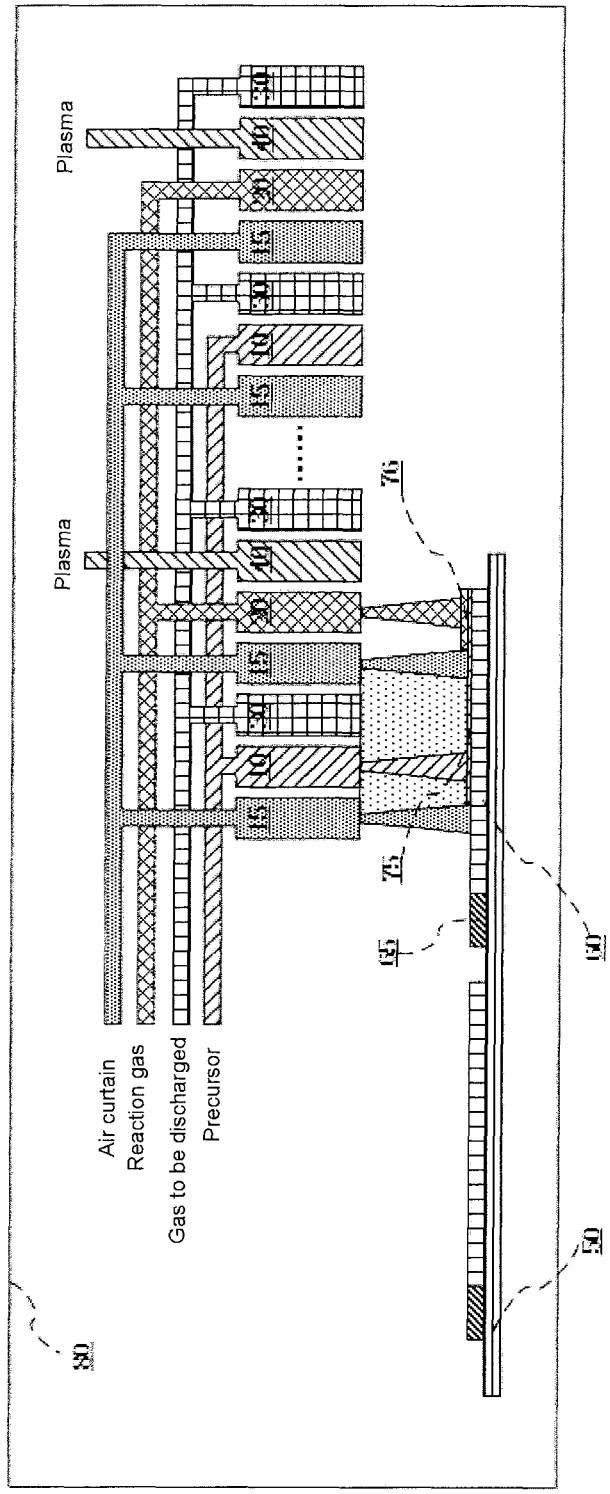
FIG. 8 is another cross-sectional view illustrating the exemplary coating device according to another embodiment of the present disclosure, in which it is illustrated that a second reactant is sprayed while the first reactant is sprayed.

FIG. 8 is another cross-sectional view illustrating the exemplary coating device 2 according to another embodiment of the present disclosure, in which a second reactant is sprayed while the first reactant is sprayed. Differently from the embodiment shown in FIG. 1, due to the presence of the air curtains, the second reactant (for example, water or water vapor) may be sprayed through the second reactant nozzle 20 onto the substrate 50 on which the first reaction layer 75 is formed while the first reactant is sprayed through the first reactant spout 10. In this way, a working cycle of the device may be saved, the time to wait for discharging is avoided, and the production efficiency is improved. Further, the second reactant is not limited to water or water vapor, but may comprise, but not limited to, oxygen, nitrous oxide ($N_2O$), etc.

In the embodiment shown in FIG. 8, the second reactant sprayed through the second reactant nozzle 20 forms a temporary second reactant layer 76 on the first reactant layer 75. However, this is not necessary. In fact, the first reactant layer 75 may react directly with the second reactant without waiting for a reaction medium which is sprayed subsequently or at the same time. In other words, in some other embodiments, the second reactant layer 76 is not necessarily formed.

Figure 9:
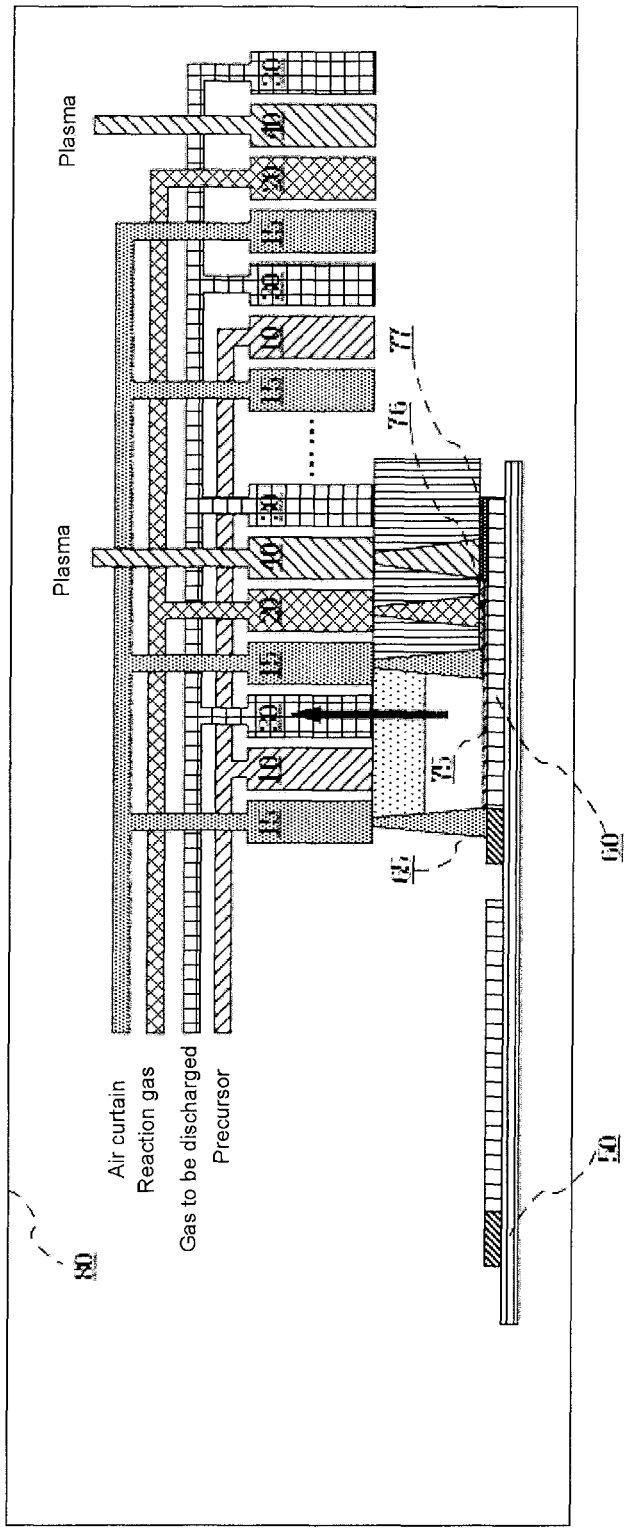
FIG. 9 is a further cross-sectional view illustrating the exemplary coating device according to another embodiment of the present disclosure, in which it is illustrated that an excessive portion of the first reactant is being discharged, and a reaction medium is sprayed while the second reactant is sprayed.

FIG. 9 is a further cross-sectional view illustrating the exemplary coating device 2 according to another embodiment of the present disclosure, in which it is illustrated that an excessive portion of the first reactant is being discharged and the reaction medium is sprayed while the second reactant is sprayed. Similarly to the embodiment shown in FIG. 2, after the first reactant layer 75 is formed on the entire coating region 60, an excessive portion of the first reactant and/or possibly a by-product need to be discharged from the reaction chamber (more specifically, the first reaction region) through the first outlet 30, to avoid an undesired film layer from being formed on the non-coating region 65. For example, in some embodiments, the excessive portion of the first reactant, the reaction by-product, and/or the shielding gas of the air curtains etc. may be discharged by purging with shielding gas (for example, an inert gas such as nitrogen, argon, etc.) Further, the excessive portion of the first reactant, the reaction by-product, and/or the shielding gas of the air curtains in the first reaction region may be discharged by vacuum extraction etc. Similarly to the embodiment shown in FIG. 2, multiple outlets 30 may also be used for discharging. For example, multiple outlets or different outlet configurations may be provided between two air curtain spouts 15.

The reaction medium may be sprayed through the reaction medium spout 40 at the same time or at other previous or subsequent suitable time to catalyze the reaction of the first reactant with the second reactant and form a desired final film layer 77 on a part of the coating region 60. It should be illustrated that due to the use of the design including the air curtains, there may be a part of the coating region 60 on which the film layer 77 has not been formed. At this time, the transport structure continues to operate, to finally transport the coating region 60 into the second reaction region having the second reactant and/or the reaction medium in a case of preventing the non-coating region 65 from entering the first reaction region where the first reactant has not been discharged, so that the desired film layer 77 is finally formed on the entire coating region 60 in the second reaction region.

Figure 10:
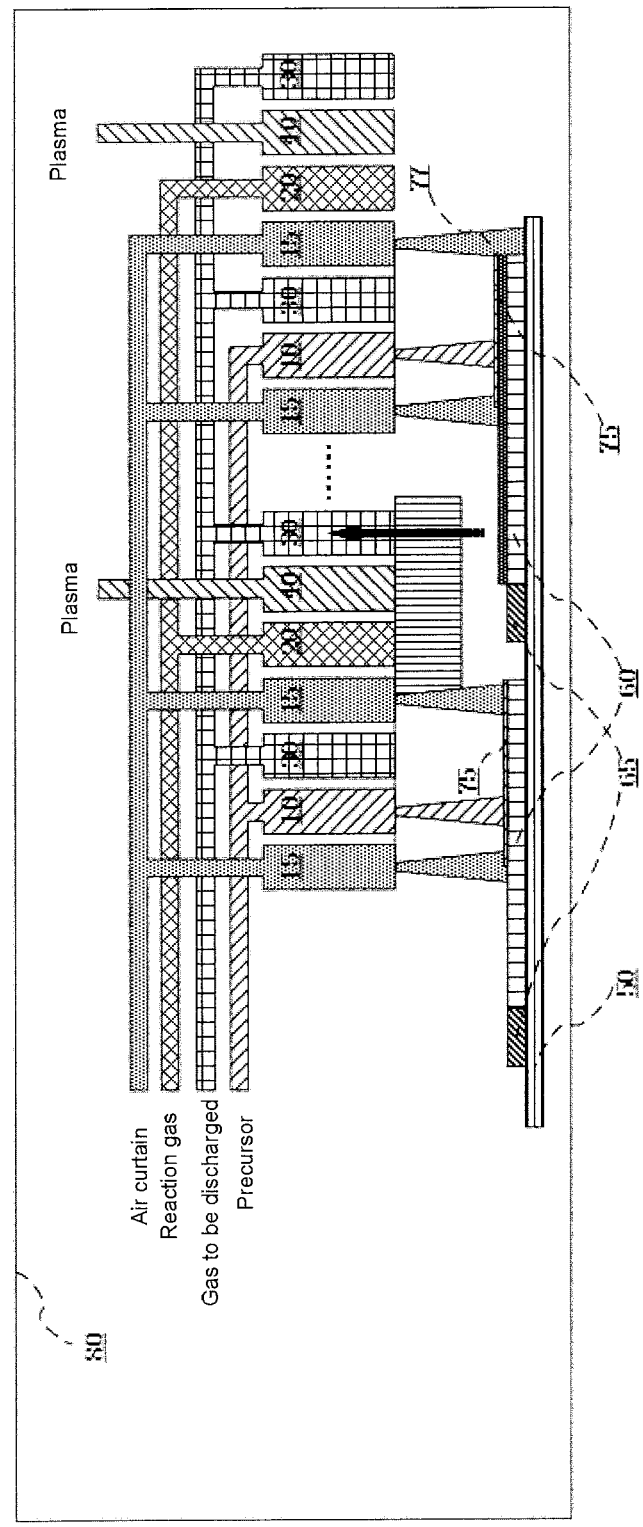
FIG. 10 is still another cross-sectional view illustrating the exemplary coating device according to another embodiment of the present disclosure, in which it is illustrated that an excessive portion of the second reactant and/or a reaction by-product are being discharged and a final film layer is formed, while a next round of spraying the first reactant starts.
Figure 13:
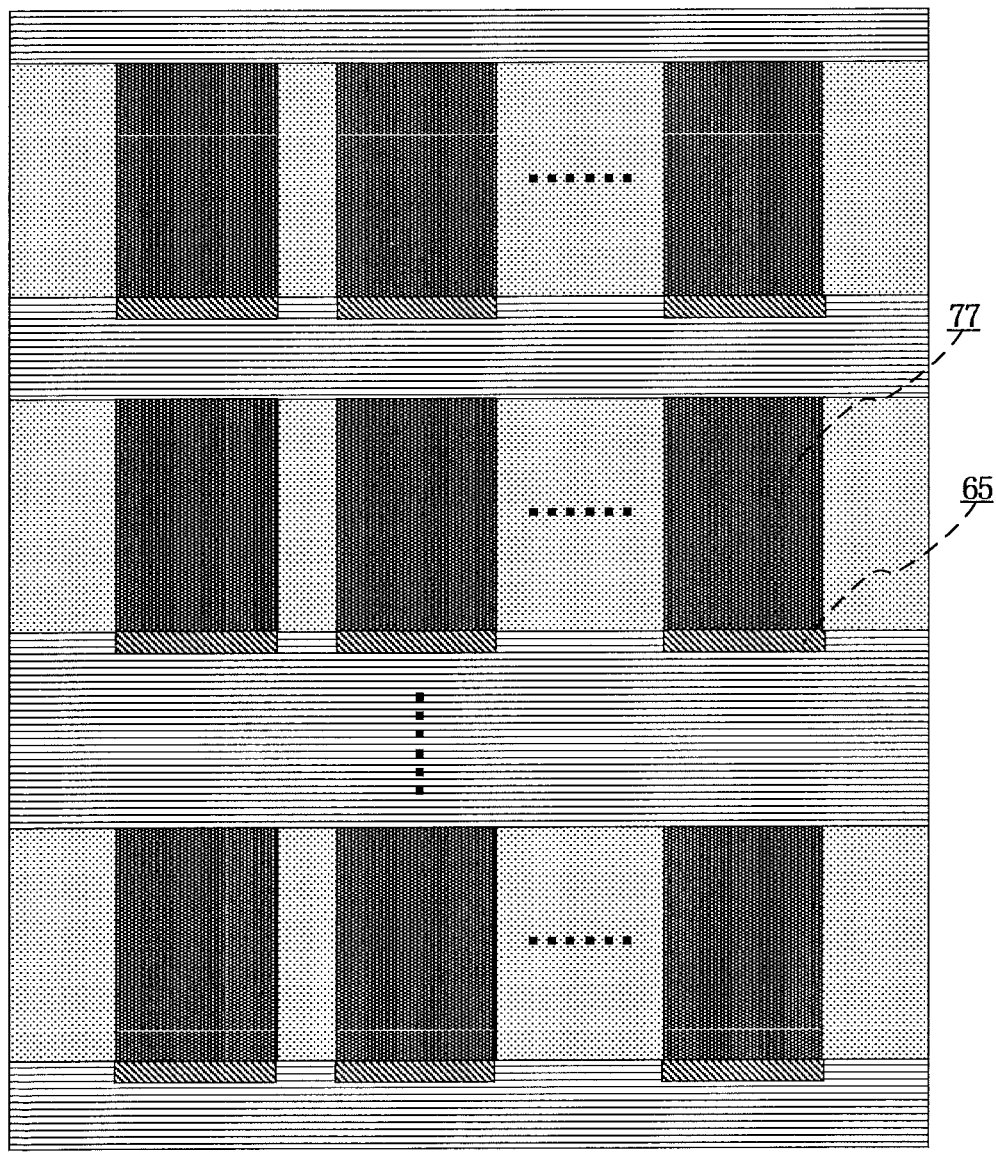
FIG. 13 is a plan view illustrating an exemplary coated device according to another embodiment of the present disclosure.

FIG. 10 is a further cross-sectional view illustrating the exemplary coating device 2 according to another embodiment of the present disclosure, in which it is illustrated that an excessive portion of the second reactant and/or a reaction by-product are discharged and a final film layer is formed, while a next round of spraying the first reactant starts. As shown in FIG. 10, after the desired film layer 77 is formed on the entire coating region 60, the substrate 50 may be transported into a spraying range of a next nozzle by using the transport mechanism to deposit a next desired film layer. Finally, all the desired film layers may be formed. For example, a final coating effect formed on a glass substrate may be as shown in FIG. 13.

It should be illustrated that in the embodiment shown in FIGS. 7-10, there is no air curtain spout 15 specifically provided at a periphery of the second reactant spout 20 and the reaction medium spout 40. This is because that in the present embodiment, the second reactant does not react with other substances than the first reactant. For example, even if the second reactant diffuses onto the inner walls 80 of the device 2, since the second reactant reacts only with the first reactant, no undesired film layer may be formed on the inner walls 80. However, the present disclosure is not limited thereto. In a case where, for example, the second reactant also reacts with substances on the inner walls or substances at positions outside the coating region 60, the air curtain spouts 15 may also be provided at a periphery of the second reactant spout 20, the reaction medium spout 40, and/or the second outlet 30. For example, another air curtain spout 15 may further be provided on the right side of the second outlet 30, so that three air curtain spouts 15 form two defined reaction regions which are a first reaction region and a second reaction region for reaction of the first reactant and reaction of the second reactant respectively.

Further, in a case where, for example, multiple nozzles are integrally provided, since a defined region (for example, the second reaction region) is also formed between a left air curtain of a next nozzle and a right air curtain of a current nozzle, it is also possible to achieve the same effect.

Figure 11:
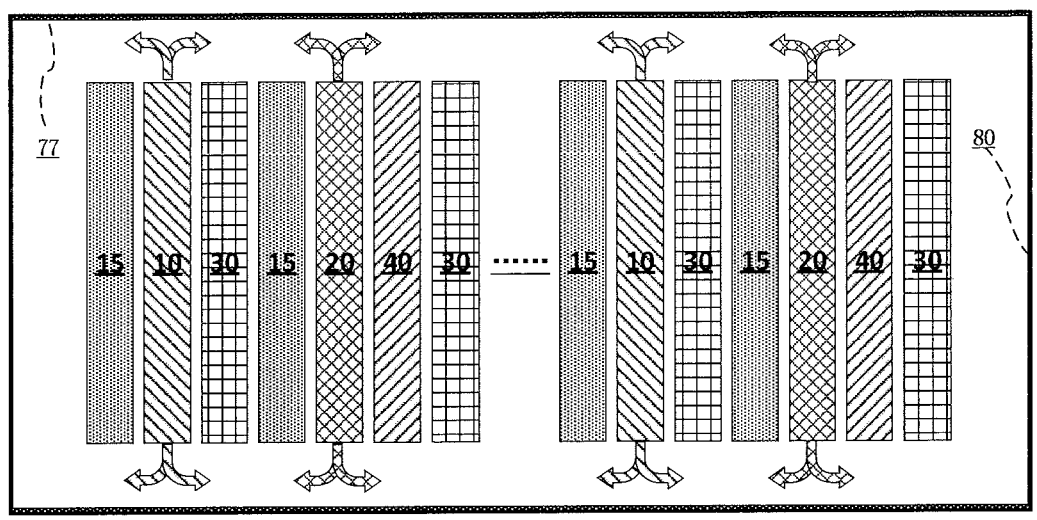
FIG. 11 is a plan view illustrating an exemplary coating device according to another embodiment of the present disclosure.

FIG. 11 is a plan view illustrating the exemplary coating device 2 according to another embodiment of the present disclosure. As shown in FIG. 11, two air curtain spouts 15 sandwich the first reactant spout 10 and the first outlet 30, so that the first reactant sprayed through the first reactant spout 10 is mostly discharged through the first outlet 30. It should be illustrated, however, that since air curtains sprayed through the air curtain spouts 15 do not completely enclose the first reaction region of the first reactant, a small amount of the first reactant may still escape to the inner walls 80 of the device 2, and finally form a film layer 77 together with the second reactant.

To this end, there is proposed a coating device 3 according to still another embodiment of the present disclosure. Hereinafter, the coating device 3 according to the other embodiment of the present disclosure will be described in detail with reference to FIG. 12.

Figure 12:
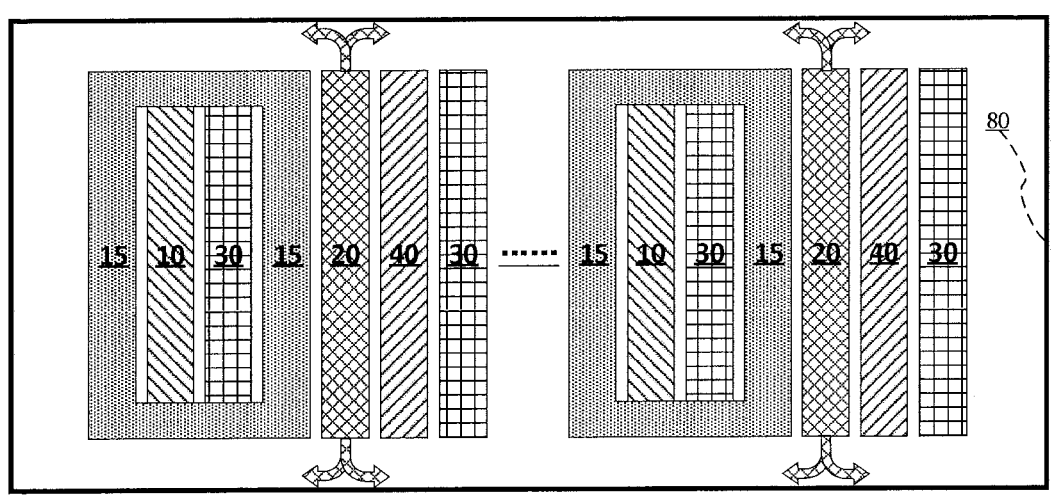
FIG. 12 is a plan view illustrating an exemplary coating device according to yet another embodiment of the present disclosure.

FIG. 12 is a plan view illustrating the exemplary coating device 3 according to still another embodiment of the present disclosure. As shown in FIG. 12, air curtain spouts 15 are formed as respective single air curtain spouts 15 and each have a closed configuration surrounding a first reactant spout 10 and a first outlet 30. Since each of the air curtain spouts 15 causes a first reactant to be completely constrained in a first reaction region, no first reactant may escape to inner walls 80 of the device 3, and thus the need for manual cleaning of the inner walls 80 of the device is completely avoided.

It should be illustrated, however, that although the spouts described above in connection with various figures are rectangular spouts, this is merely for convenience of illustration and description. In fact, the spouts may have different shapes and/or configurations. For example, various spouts on the nozzles may be concentrically circular, for example, from the inside to the outside, the first reactant spout, the first outlet, the first air curtain spout, the second reactant spout, the reaction medium spout, the second outlet, and/or possibly the second air curtain spout are concentrically circular. As another example, the spouts may have any regular or irregular shape such as a circle, a rectangle, a square, a trapezoid, a diamond, a triangle, etc. Further, in some embodiments, the air curtain spouts may be parallel or substantially parallel to the other spouts and may be equal or substantially equal to the other spouts in length.

In addition, in some embodiments of the present disclosure, a spraying pressure for the air curtain spout 15 is higher than that for the first reactant or precursor spout 10, and a spraying pressure for the first reactant or precursor spout 10 is higher than that in a chamber of the device. However, the present disclosure is not limited thereto.

Figure 14:
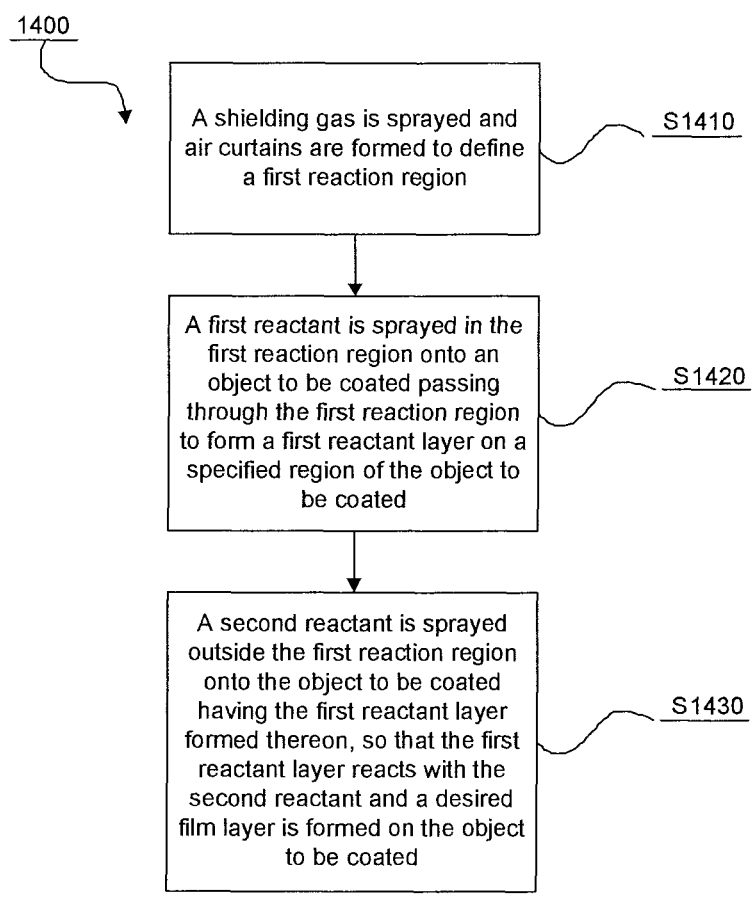
FIG. 14 is a flowchart illustrating an exemplary coating method according to an embodiment of the present disclosure.

FIG. 14 is a flowchart illustrating an exemplary coating method 1400 according to an embodiment of the present disclosure. The method in FIG. 14 starts at step S1410.

In step S1410, shielding gas may be sprayed and air curtains may be formed to define a first reaction region.

In step S1420, a first reactant may be sprayed in the first reaction region onto an object to be coated passing through the first reaction region to form a first reactant layer on a specified region of the object to be coated.

In step S1430, a second reactant may be sprayed outside the first reaction region onto the object to be coated having the first reactant layer formed thereon, so that the first reactant layer reacts with the second reactant and a desired film layer is formed on the object to be coated.

In some embodiments, the object to be coated may pass through the first reaction region in a linear reciprocating manner. In some embodiments, the method 1400 may further comprise: after the first reactant layer is formed, discharging an excessive portion of the first reactant in the first reaction region; and after the desired film layer is formed, discharging an excessive portion of the second reactant and/or a reaction by-product outside the first reaction region. In some embodiments, the method 1400 may further comprise: spraying a reaction medium for catalyzing reaction of the first reactant with the second reactant before the second reactant is sprayed. In some embodiments, the reaction medium may be plasma.

By using the coating nozzle, the coating device and the corresponding coating method according to the embodiments of the present disclosure, it is possible to prevent a coating film to be formed at unnecessary positions in the device (for example, inner walls of the device or a non-coating region of the substrate) while coating the object to be coated, which reduces the time to clean the device and improve the utilization rate of the device.

The present disclosure has been described hereto in connection with the preferred embodiments. It should be understood that various other changes, substitutions and additions may be made by those skilled in the art without departing from the spirit and scope of the present disclosure. Therefore, the scope of the present disclosure is not limited to the specific embodiments described above, but should be defined by the appended claims.

We claim:

1. A coating nozzle, comprising:
   a first reactant spout configured to spray a first reactant;
   a second reactant spout configured to spray a second reactant; and
   a first air curtain spout configured to spray shielding gas, so that the sprayed shielding gas forms an air curtain which isolates the first reactant from the second reactant, wherein the first air curtain spout has a closed configuration surrounding the first reactant spout, so that the air curtain formed causes the first reactant to be completely constrained in a first reaction region, and isolates the first reaction region from a second reaction region of the second reactant,
   wherein a spraying pressure for the first air curtain spout is greater than that for at least one of the first reactant spout and the second reactant spout.

2. The coating nozzle according to claim 1, further comprising:
   a first outlet configured to discharge at least one of an excessive portion of the first reactant and a reaction by-product; and
   a second outlet configured to discharge at least one of an excessive portion of the second reactant and a reaction by-product.

3. The coating nozzle according to claim 1, further comprising:
   a reaction medium spout configured to spray a reaction medium which catalyzes a reaction of the first reactant with the second reactant.

4. The coating nozzle according to claim 3, wherein the reaction medium is plasma.

5. A coating device, comprising:
   one or more coating nozzles according to claim 3; and
   a transport mechanism configured to transport an object to be coated, so that the object to be coated sequentially passes through the first reaction region of the first reactant and the second reaction region of the second reactant for each of the one or more coating nozzles.

6. The coating nozzle according to claim 1, comprising multiple serial connected groups of spouts, wherein each group of spouts comprises at least the first reactant spout, the second reactant spout, and the first air curtain spout.

7. A coating device, comprising:
   one or more coating nozzles according to claim 1; and
   a transport mechanism configured to transport an object to be coated, so that the object to be coated sequentially passes through the first reaction region of the first reactant and the second reaction region of the second reactant for each of the one or more coating nozzles.

8. The device according to claim 7, wherein the transport mechanism is configured to transport the object to be coated in a linear reciprocating manner.

* * * * *